United States Patent
Zhou

(10) Patent No.: US 12,295,108 B2
(45) Date of Patent: May 6, 2025

(54) COMPONENT CARRIER WITH PARTIALLY METALLIZED HOLE USING ANTI-PLATING DIELECTRIC STRUCTURE AND ELECTROLESS PLATEABLE SEPARATION BARRIERS

(71) Applicant: AT&S Austria Technologie & Systemtechnik Aktiengesellschaft, Leoben (AT)

(72) Inventor: Jiangfeng Zhou, Wuxi (CN)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 176 days.

(21) Appl. No.: 18/046,609

(22) Filed: Oct. 14, 2022

(65) Prior Publication Data

US 2023/0119480 A1    Apr. 20, 2023

(30) Foreign Application Priority Data

Oct. 15, 2021   (CN) .......................... 202111202401.1

(51) Int. Cl.
*H05K 3/42* (2006.01)
*H01L 21/48* (2006.01)
(Continued)

(52) U.S. Cl.
CPC ......... *H05K 3/429* (2013.01); *H01L 21/4857* (2013.01); *H01L 21/486* (2013.01);
(Continued)

(58) Field of Classification Search
CPC ................. H05K 1/298; H05K 1/0251; H05K 2201/09545; H05K 2203/0207; H05K 3/429; H05K 1/034; H05K 1/0346; H05K 1/036; H05K 1/115; H05K 3/064; H05K 3/108; H05K 3/427; H05K 1/0306; H05K 3/0047; H05K 2201/015; H05K 2201/0154; H05K 2201/09509; H05K 2203/072; H05K 2203/0723; H05K 1/116; H05K 3/4652;
(Continued)

(56) References Cited

U.S. PATENT DOCUMENTS 10,201,098 B2    2/2019   Kallman et al.
10,820,427 B2    10/2020  Iketani et al.
(Continued)

FOREIGN PATENT DOCUMENTS

CN          103369868 A      10/2013

OTHER PUBLICATIONS

Engel, L.; Extended European Search Report in Application No. EP 22196805.0; pp. 1-10; Jun. 2, 2023; European Patent Office; 80298, Munich, Germany.

*Primary Examiner* — Timothy J Thompson
*Assistant Examiner* — Paramita Ghosh
(74) *Attorney, Agent, or Firm* — Robert A. Blaha; Smith Tempel Blaha LLC

(57) ABSTRACT

A component carrier includes a stack with at least one electrically conductive layer structure, at least one electrically insulating layer structure, and a hole in the stack having a first hole portion covered with metal and having a second hole portion not covered with metal, wherein the second hole portion is defined by an anti-plating dielectric structure and an electroless plateable separation barrier.

20 Claims, 5 Drawing Sheets

(51) Int. Cl.
  H01L 23/498 (2006.01)
  H05K 1/03 (2006.01)
  H05K 1/11 (2006.01)
  H05K 3/06 (2006.01)
  H05K 3/10 (2006.01)
  H05K 3/00 (2006.01)

(52) U.S. Cl.
  CPC .. H01L 23/49822 (2013.01); H01L 23/49894 (2013.01); H05K 1/034 (2013.01); H05K 1/0346 (2013.01); H05K 1/036 (2013.01); H05K 1/115 (2013.01); H05K 3/064 (2013.01); H05K 3/108 (2013.01); H05K 3/427 (2013.01); H05K 1/0306 (2013.01); H05K 3/0047 (2013.01); H05K 2201/015 (2013.01); H05K 2201/0154 (2013.01); H05K 2201/09509 (2013.01); H05K 2203/072 (2013.01); H05K 2203/0723 (2013.01)

(58) Field of Classification Search
  CPC ... H05K 2201/09645; H05K 2203/071; H05K 3/42; H01L 21/4857; H01L 21/486; H01L 23/49822; H01L 23/49894
  See application file for complete search history.

(56) References Cited

U.S. PATENT DOCUMENTS

| | | |
|---|---|---|
| 2008/0301934 A1 | 12/2008 | Dudnikov, Jr. |
| 2014/0196939 A1* | 7/2014 | Nishida .................. H05K 3/28 174/261 |
| 2014/0251663 A1 | 9/2014 | Iketani et al. |
| 2014/0262455 A1 | 9/2014 | Iketani et al. |
| 2015/0181724 A1 | 6/2015 | Iketani et al. |
| 2018/0027666 A1 | 1/2018 | Doyle et al. |
| 2018/0086452 A1 | 3/2018 | Hunt et al. |
| 2019/0141840 A1 | 5/2019 | Thompson et al. |
| 2019/0182968 A1 | 6/2019 | Kuczynski et al. |
| 2020/0015364 A1* | 1/2020 | Iketani .................. H05K 1/115 |
| 2020/0068711 A1* | 2/2020 | Wolter .................. H05K 1/185 |

* cited by examiner

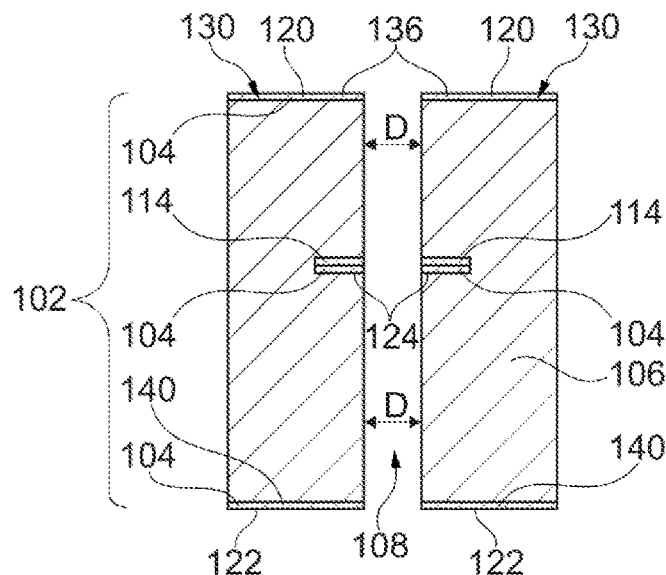
Fig. 4
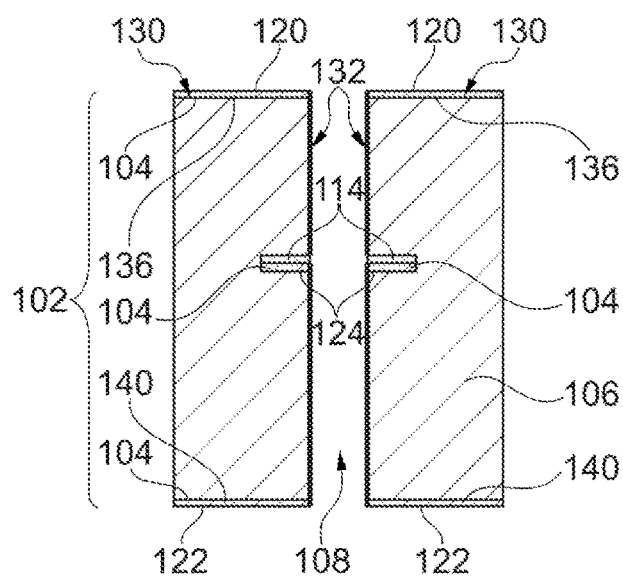
Fig. 5
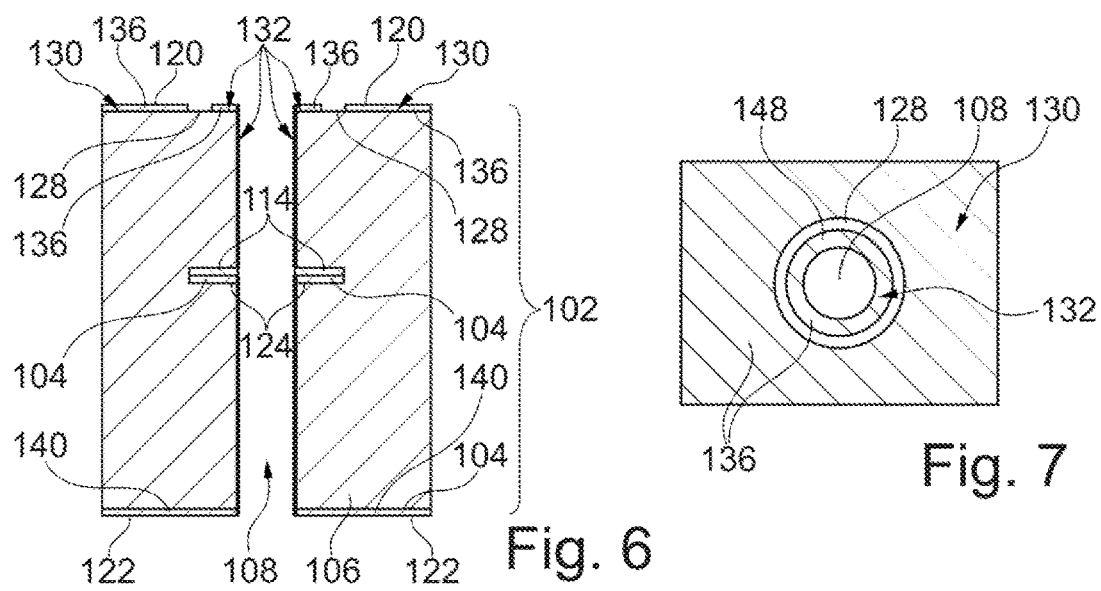
Fig. 6
Fig. 7

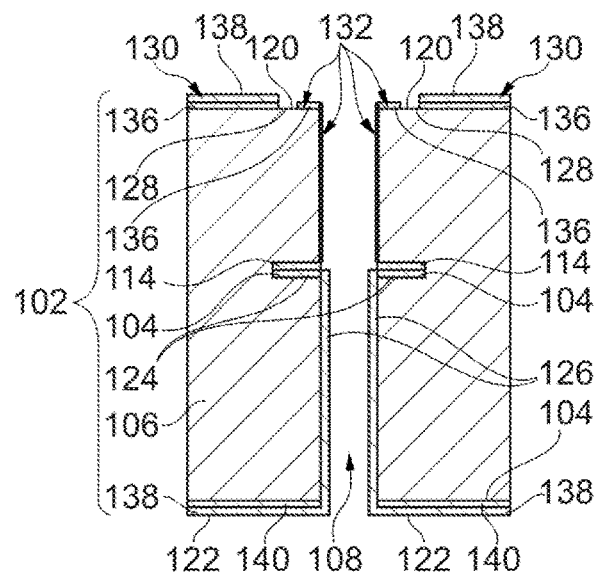
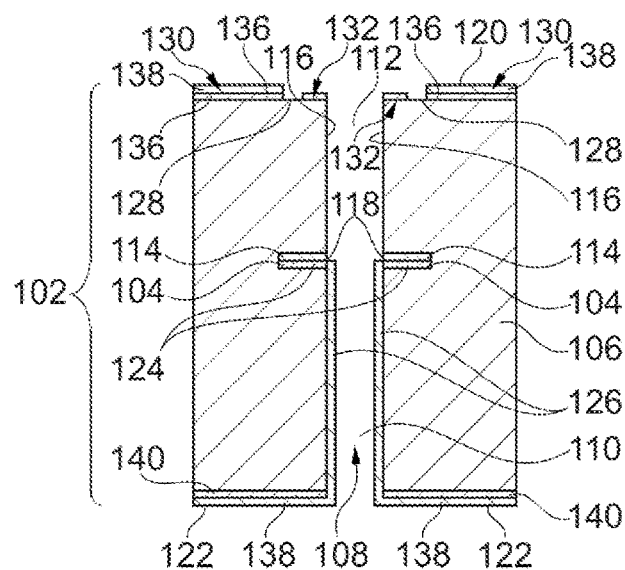
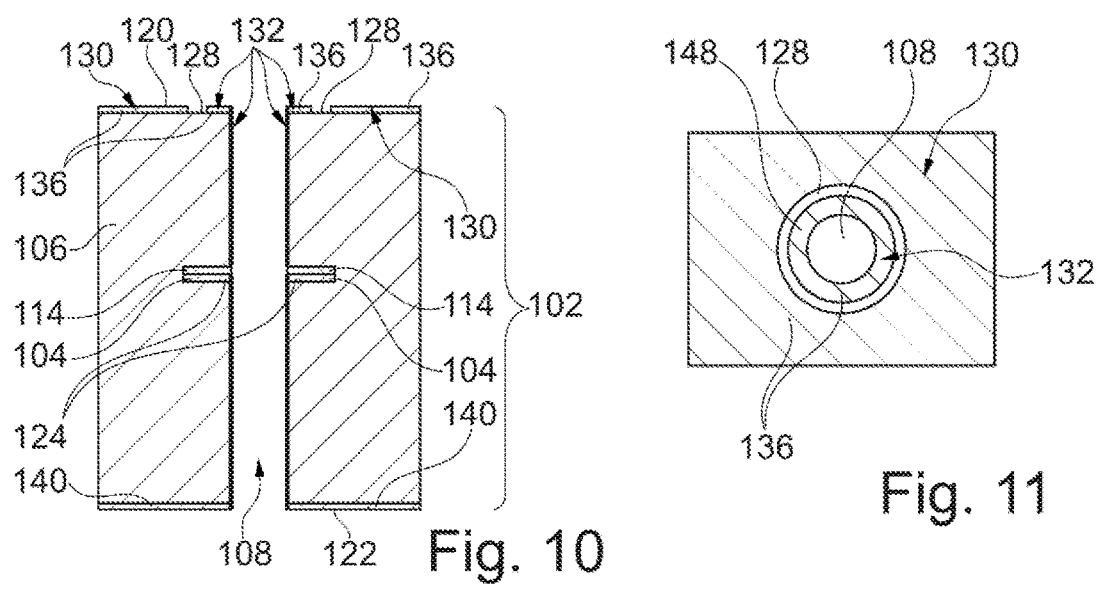

COMPONENT CARRIER WITH PARTIALLY METALLIZED HOLE USING ANTI-PLATING DIELECTRIC STRUCTURE AND ELECTROLESS PLATEABLE SEPARATION BARRIERS

CROSS-REFERENCE TO RELATED APPLICATIONS

This application claims the benefit of the filing date of Chinese Patent Application No. 202111202401.1, filed on Oct. 15, 2021, the disclosure of which is hereby incorporated herein by reference.

TECHNICAL FIELD

Embodiments of the present invention relate to a component carrier, a method of manufacturing a component carrier and a method of use.

BACKGROUND ART

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

Moreover, parasitic effects (like insertion losses, distortion, etc.) may occur when high-frequency signals propagate along wiring structures of a component carrier. This may substantially degrade the overall performance of mobile communication systems, etc.

SUMMARY

There may be a need to provide a component carrier with high performance in terms of signal transmission.

According to an exemplary embodiment of the invention, a component carrier is provided, wherein the component carrier comprises a stack comprising at least one electrically conductive layer structure and/or at least one electrically insulating layer structure, and a hole in the stack having a first hole portion covered with metal and having a second hole portion not covered with metal, wherein the second hole portion is defined by an anti-plating dielectric structure and an electroless plateable separation barrier.

According to another exemplary embodiment of the invention, a meth-od of manufacturing a component carrier is provided, wherein the method comprises providing a stack comprising at least one electrically conductive layer structure and/or at least one electrically insulating layer structure, forming a hole in the stack with a first hole portion covered with metal and with a second hole portion not covered with metal, and defining the second hole portion by an anti-plating dielectric structure and an electroless plateable separation barrier.

According to still another exemplary embodiment of the invention, a component carrier having the above-mentioned features is used for a high-frequency and high-speed application, in particular for conducting a radio frequency (RF) signal, in particular a radio frequency signal with a frequency above 1 GHz.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" (of a readily manufactured component carrier or of a corresponding preform or semifinished product) may particularly denote a sequence of two or more layer structures formed on top of each other. For instance, layer structures of a layer stack may be connected by lamination, i.e., the application of heat and/or pressure.

In the context of the present application, the term "layer structure" may particularly denote a continuous layer, a patterned layer or a plurality of non-consecutive islands within a common plane.

In the context of the present application, the term "hole" may particularly denote a recess or an opening extending partially or entirely through the layer stack and being oriented perpendicular or slanted with respect to main surfaces of the layer stack and/or layer structures thereof. Preferably, the hole is a vertical hole. In particular, the hole may be a through hole, i.e., a hole extending through the entire layer stack. Alternatively, the hole may be a blind hole, i.e., a hole extending through only part of the layer stack. In one embodiment, the hole is hollow, i.e., is not filled with solid material but with a gas such as air. In another embodiment, the hole may be at least partially filled with a dielectric, in particular a low DK dielectric.

In the context of the present application, the term "anti-plating dielectric structure" may particularly denote an electrically insulating structure made of a material on which plating of a metal is inhibited, disabled or made impossible. Preferably, not only electroplating but also electroless plating may be inhibited, disabled, or made impossible on the anti-plating dielectric structure. This can be accomplished by providing the anti-plating dielectric structure from a non-adhesive or very poorly adhesive dielectric material with preferably hydrophobic properties on which plated metal does not adhere. Also, non-polarized properties of the anti-plating dielectric structure may be advantageous. Electroless plating may encompass chemical plating and sputtering. Chemical plating may refer to a chemical process to create a metal coating, for instance by an autocatalytic chemical reduction of metal cations in a liquid bath. Sputtering may be denoted as a deposition process in which microscopic particles of a solid material are ejected from its surface, after the material is itself bombarded by energetic particles, for instance of a plasma or gas. Electroless plating may denote plating accompanied by the application of an electric current or an electric voltage. One advantageous example of electroless plating is galvanic plating using electricity in a galvanic bath. For electroplating, and in particular galvanic plating, of electrically conductive material on a seed layer formed by electroless plating, water-based solutions or electrolytes may be used which contain metal to be deposited as ions (for example as dissolved metal salts). An electric field between a first electrode (in particular an anode) and the preform of the component carrier to be manufactured as second electrode (in particular a cathode) may force (in particular positively charged) metal ions to move to the second electrode (in particular cathode) where they give up their charge and deposit themselves as metallic material on the surface of the through hole. However, the anti-plating dielectric structure may be configured to allow neither electroless plating nor electroplating.

In the context of the present application, the term "electroless plateable separation barrier" may particularly denote a physical and an electric barrier for metallic material contributing to prevent a hole portion from being coated with metal, in particular by electroplating. For example, the separation barrier may be formed by a surface portion of the stack or a recess in the stack on which in principle a metal can be deposited by electroless plating, but which nevertheless contributes to inhibit or disable deposition or application of metallic material to the second hole portion. Hence, the electroless plateable separation barrier may be in principle suitable to be covered by metal provided by electroless plating, but nevertheless acts as a spacer preventing metal from reaching the second hole portion, in particular during electroplating (for instance galvanic plating). For instance, the electroless plateable separation barrier may be formed by a surface portion of an electrically insulating layer structure (for instance made of a resin, optionally comprising reinforcing particles, for example prepreg or FR4) of a stack of the component carrier, said surface portion being not covered by a metal in the readily manufactured component carrier (wherein for instance a temporary metal can be removed from said surface portion during forming the plateable separation barrier). Preferably, the electroless plateable separation barrier may be made of a dielectric material or may have a dielectric surface being non-electroplateable.

In the context of the present application, the term "high-frequency application" may particularly denote a task fulfilled by the component carrier or to which the component carrier contributes, wherein the task may relate to the handling of a radio frequency signal. Such a radio or high-frequency signal may be an electric or electromagnetic signal propagating along a wiring structure (which may encompass a horizontal trace of an electrically conductive layer structure of the stack and metal in the first hole portion) in a range of frequencies used for communications or other signals. In particular, a radio frequency (RF) signal may for example have a frequency in a range from 100 MHz to 300 GHz, in particular in a range from 20 GHz to 120 GHz.

According to an exemplary embodiment of the invention, a component carrier may be provided which has excellent properties in terms of processing high frequency signals. Advantageously, this can be accomplished by providing a hole in a component carrier having a first hole portion being covered by a metal in a defined way, whereas a second hole portion may be provided being reliably free of metal. Preferably, an interface between the metallized first hole portion and the metal-free second hole portion may be electrically connected with a horizontal electrically conductive trace. Thus, a stub-free component carrier may be provided. Such a stub may be an artificial electrically conductive structure which may occur conventionally in a high-frequency component carrier as an artifact created due to back drilling of a metallized hole. Such a need of back drilling of a metallized hole may become dispensable according to exemplary embodiments of the invention by the combined provision of an anti-plating dielectric structure and an electroless plateable (and preferably non-electroplateable) separation barrier. More specifically, an anti-plating dielectric structure may be exposed at the stack so that said dielectric structure is not coverable by a metal during plating, i.e., neither during electroless plating nor during electroplating. Descriptively speaking, said anti-plating dielectric structure may define one conduction path breakpoint between the first hole portion and the second hole portion for spatially controlling a hole region of allowed metallization, since metal deposition in the first hole portion may be stopped at the anti-plating dielectric structure. However, an anti-plating dielectric structure may be poorly adhesive with respect to other materials of the stack and may also introduce a foreign material in the component carrier. In order to ensure proper intra-layer structure adhesion within the stack and for introducing only a small amount of foreign materials in the component carrier, a second conduction path breakpoint for preventing metal deposition in the second hole portion may be defined by an electroless plateable, but preferably non-electro-plateable, separation barrier rather than by a further anti-plating dielectric structure. Such an electroless plateable separation barrier may be made of material on which electroless plating is possible but may be processed to interrupt a metallic path to extend up to the second hole portion. By taking this measure, a precise definition of a first hole portion being covered with metal and a second hole portion being uncovered by a metal may be made possible without compromising on mechanical integrity of the component carrier and without introducing an unduly high amount of foreign materials in the component carrier. Artefacts such as formation of a stub may thus be prevented, so that a component carrier with low signal loss and excellent high-frequency properties may be obtained.

In the following, further exemplary embodiments of the method and the component carrier will be explained.

In an embodiment, the first hole portion is lined with metal. In particular, an entire hollow cylindrical first hole portion may be continuously covered with a metal such as copper.

In an embodiment, the anti-plating dielectric structure is embedded in the stack and is exposed at an interface between the first hole portion and the second hole portion. Embedding the anti-plating structure within the stack may keep the poorly adhesive surface portion and thus the amount of foreign material in the stack very small. Furthermore, exposing the anti-plating dielectric structure within the hole allows to precisely define a position at which metal deposition stops. In particular by avoiding an anti-plating material on the front and back layer of the stack, the appearance and the adhesive properties of the component carrier may be improved. Even when the anti-plating dielectric structure is made of a biohazardous and/or volatile material, it may be shielded with respect to a user when embedded inside the stack and exposed only at a ring portion of the hole.

In an embodiment, the separation barrier is located at a main surface of the stack. This simplifies processing of the separation barrier.

In an embodiment, the anti-plating dielectric structure comprises a planar pad. For example, a pad-type anti-plating dielectric structure comprises a dielectric ring structure. More specifically, the anti-plating dielectric structure may be an electrically insulating ring embedded in the stack and being circumferentially exposed in the hole at the interface between the first hole portion and the second hole portion. For example, such a planar anti-plating dielectric structure may be pressed within the stack by lamination.

In another embodiment, the anti-plating dielectric structure comprises an inlay. For instance, the anti-plating dielectric structure may be a block of a poorly adhesive material or a block coated partially or entirely with a poorly adhesive non-plating material and being embedded in the stack. Such an inlay may provide an additional function, for instance a cooling function when poorly adhesive non-plating material coats a highly thermally conductive block made of metal (such as copper) or made of a ceramic (such as aluminum nitride).

In an embodiment, the anti-plating dielectric structure is formed on a metallic pad connected to a metallic trace. Metallic pad and metallic trace may form part of an electrically conductive layer structure of the stack. In particular, two ring-shaped pads may be stacked on top of each other, for instance a dielectric anti-plating ring may be formed on a metallic ring connected to a horizontally extending metallic trace. A signal (such as a high-frequency signal) may then propagate between the trace and the metal in the first hole portion via the metallic ring. At the same time, the dielectric anti-plating ring may disable formation of an undesired metallic stub extending into the second hole portion.

In an embodiment, the separation barrier comprises a metal-free region, in particular an annular metal-free region, delimited at an exterior side by a metallic structure. For instance, the separation barrier may be formed by lithographically patterning a metal layer on a main surface of the stack, thereby forming a ring free of metal breaking a conduction path towards the second hole portion and thereby ensuring that the second hole portion remains free of metal, in particular during an electroplating process.

In an embodiment, it may be preferred that the component carrier comprises an electrically conductive ring structure connected with the anti-plating dielectric structure, and preferably configured as dielectric ring structure. Preferably, the electrically conductive ring structure is connected with the metal in the first hole portion. This ensures simultaneously a fully circumferentially electric coupling between electrically conductive ring structure and a horizontal trace as well as a fully circumferentially disabling of an undesired extension of the metal into the second hole portion.

In an embodiment, the anti-plating dielectric structure is hydrophobic. Consequently, an aqueous solution may be prevented from adhering to the anti-plating dielectric structure during a wet process, such as galvanic plating.

In an embodiment, the anti-plating dielectric structure comprises at least one of a group consisting of a release ink, polytetrafluoroethylene, and polyimide. For instance, such a non-adhesive or poorly adhesive structure may be made of Teflon, polyimide, a waxy material or a suitable varnish. As a release ink, a material may be implemented as anti-plating structure which may conventionally be used for forming a cavity in a stack by embedding a layer of release ink in the stack and by circumferentially cutting out a stack piece which does not adhere at its bottom side to the release ink and can thus be taken out from the rest of the stack.

In an embodiment, the hole has a homogeneous thickness or has a substantially constant diameter in the first hole portion and in the second hole portion. This may be the consequence of a drilling process for forming the entire hole by drilling using a rotating mechanical drill bit. Consequently, a circular cylindrical drill hole may be formed as the stack hole delimited by a continuous step-free interior surface area of the stack. This is contrary to conventional approaches in which a conventionally occurring stub may be shortened by back drilling, which may involve the use of a second mechanical drill penetrating into the stack hole from the backside with a larger diameter as compared to a mechanical drill previously forming the entire hole. A continuous diameter of the hole may further promote the excellent high-frequency properties of the component carrier, since it may prevent losses of high-frequency signals. For instance, the diameter of the hole may be not more than 400 µm, in particular in a range from 150 µm to 400 µm, for example 200 µm.

In an embodiment, a thickness of the anti-plating dielectric structure is in a range from 10 µm to 50 µm, in particular in a range from 20 µm to 30 µm. Thus, already a very thin anti-plating dielectric layer may be sufficient for reliably delimiting the first hole portion with respect to the second hole portion. By taking this measure, tendencies of delamination or warpage in the component carrier may be prevented. Moreover, the amount of foreign materials in the component carrier may be kept low by taking this measure.

In an embodiment, the metal in the first hole portion extends up to and along a main surface of the stack. For instance, a cross-sectional view of the metal in the first hole portion and its extension along a main surface (in particular, a bottom main surface) of the stack may be L-shaped at each of two sidewalls of the hole in a cross-sectional view (see for instance FIG. 1). In combination with a metallic pad which may be connected with a horizontal electrically conductive trace, a substantially C-shaped electrically conductive structure may be obtained at each of two opposing sidewalls of the through hole in a cross-sectional view (see again FIG. 1 as an example). Said substantially C-shaped electrically conductive structure may be used for signal transmission during operation of the component carrier, in particular, for high-frequency signal transmission.

In an embodiment, the component carrier is configured as stub-less radiofrequency component carrier. A gist of an exemplary embodiment is to implement a combination of anti-plating dielectric structure and an electroless plateable separation barrier to entirely avoid a conventionally occurring unused portion (also denoted as stub) of a copper barrel from a plated through hole in a printed circuit board (PCB) or other kind of component carrier. When high-speed signals travel between layers along a path, they can be distorted. If the signal layer usage results in a stub and the stub is excessively long, the distortion becomes significant. Advantageously, entirely eliminating a stub may ensure a more stable and repeatable performance of HF features of a component carrier according to an exemplary embodiment of the invention.

In an embodiment, the second hole portion extends between the anti-plating dielectric structure and the separation barrier. More specifically, the anti-plating dielectric structure may define one end point of the second hole portion. When the separation barrier extends up to the hole, the separation barrier may define a second end point of the second hole portion. However, it is also possible that the separation barrier is provided on a main surface of the stack and therefore spaced with respect to the second hole portion so that the separation barrier may be spaced with respect to the anti-plating dielectric structure by the second hole portion and by a connected surface portion of said main surface.

In an embodiment, the component carrier comprises only a single anti-plating dielectric structure. Thanks to the presence of the electroless plateable separation barrier (which is suitable for electroless plating in contrast to the anti-plating dielectric structure), only one anti-plating dielectric structure may be enough for precisely defining the spatial extension of the second hole portion of the hole being not covered with a metal. As a consequence, the amount of foreign material in a component carrier may then be kept very small. Furthermore, intra-stack adhesion of the component carrier may be kept intact by strictly limiting poorly adhesive material of the component carrier without compromising on its high-frequency performance.

In an embodiment, the anti-plating dielectric structure separates the second hole portion from the metal covering the first hole portion. In other words, the anti-plating dielectric structure may precisely define the interface between first hole portion and second hole portion, because metal deposition on the first hole portion will precisely stop at the anti-plating dielectric structure without extending unintentionally into the second hole portion. Descriptively speaking, the anti-plating dielectric structure may constitute an unbridgeable spacer for a growing metal.

In an embodiment, the separation barrier separates the second hole portion from a metallic structure outside of the hole. Such a metallic structure on a main surface of the stack may for instance form an exterior electric path of the component carrier allowing to electrically connect the component carrier with an electronic periphery. The separation barrier may prevent undesired signal propagation between such an exterior metallic structure and metal in the hole.

In an embodiment, said metallic structure is a multi-layer structure. For example, the metallic structure may be a double layer structure or a triple-layer structure. For instance, the multi-layer structure may comprise part of a metal foil (such as a copper foil) laminated onto an electrically insulating layer structure of the stack. It is also possible that the multi-layer structure comprises part of a seed layer formed by electroless plating in terms of the creation of the metal in the first hole portion and extending also to surface portions of the stack apart from the hole. Furthermore, the multi-layer structure may comprise a panel plating structure or a surface finish. Hence, the separation barrier also guarantees the freedom to form the metallic structure as desired.

In an embodiment, the separation barrier is not electroplateable, i.e., is not suitable to be covered by a metal when subjected to electroplating, in particular galvanic plating. By being incapable of allowing electroplating of a metal on the separation barrier, the separation barrier may efficiently function as an inhibitor for preventing deposition of a metal by electroplating on itself and in the second hole portion, which is delimited at one side by the non-electro-plateable separation barrier. For rendering the separation barrier non-electro-plateable, the separation barrier may for example be formed as a dielectric surface portion of the stack, i.e., a surface portion of an exposed electrically insulating layer structure of the stack.

In an embodiment, the second hole portion is electrically isolated by and between the anti-plating dielectric structure and the separation barrier. Advantageously, this breakage of a conductive path along the second hole portion by an interaction of the anti-plating dielectric structure and the separation barrier disables the second hole portion from being covered with a metal during electroplating, and thereby enables formation of the second hole portion without stub. Consequently, a component carrier with low loss behavior during transmission of high-frequency signals can be obtained.

In an embodiment, the method comprises forming the separation barrier by lithography. For example, such a lithography process may pattern a previously continuous metal layer on a main surface of the stack. When removing such a metal layer selectively from a surface portion, in particular from an annular surface portion, of the stack, the separation barrier may be created with low effort. For instance, a lithography process may pattern a resist layer using a mask and may thereafter etch away selectively an exposed surface region of the metal layer beneath.

In an embodiment, the method comprises processing the first hole portion and the second hole portion by electroless plating of metal in both the first hole portion and the second hole portion, followed by electroplating of metal in the first hole portion but not in the second hole portion, and followed by metal etching removing the electroless plated metal in the second hole portion. Generally, metal may be deposited during electroless plating substantially on any exposed surface of the stack with the exception of the anti-plating dielectric structure. The separation barrier may then be formed by patterning surface metal in a way that any metal between separation barrier and anti-plating dielectric structure is electrically decoupled from other metallic structures of the stack. Thereafter, an electroplating process may be carried out by applying an electric current to or between metallic structures of the stack excluding the region between the separation barrier and the anti-plating dielectric structure encompassing the second hole portion, but including a region being electrically connected with the first hole portion. This may form the metal in the first hole portion. In order to remove any electroless metal in the second hole portion, an etching process may then be carried out which may non-selectively remove a certain thickness of metal from any surface to such an extent that the second hole portion is free of metal but a substantial amount of metal remains at least in the first hole portion.

In an embodiment, the method comprises forming the separation barrier as an annular recess delimited at an exterior side by a metallic structure on the stack and delimited at an interior side by a further temporary metallic structure partially on the stack and partially in the stack. For instance, the exterior metallic structure may accomplish an electric coupling of the readily manufactured component carrier with an electronic periphery. In contrast to this, an only temporary metallic structure which may also extend in a semifinished product into the second hole portion due to non-selective electroless plating during the manufacturing process (for instance a thin seed layer with a thickness below 5 µm, and in particular below 1 µm) may be removed prior to completing manufacture of the component carrier (and may thus be denoted as a temporary metallic structure).

In an embodiment, the method comprises forming the temporary metallic structure with at least one metallic ring structure at an exterior first main surface of the stack and/or in the second hole portion. Such a temporary metallic structure is shown in FIG. 6 and FIG. 7 and can be re-moved partially or entirely before the component carrier is readily manufactured. Thus, the method may comprise removing at least part of the temporary metallic structure before completing manufacture of the component carrier. Hence, at least the second hole portion may become entirely metal-free when the manufacturing process is completed.

In an embodiment, the method comprises forming the hole by drilling, in particular by mechanically drilling. While formation of the hole by etching or laser drilling is possible in certain embodiments, mechanically drilling may be preferred because this may allow to create a hole even in very thick component carriers and with continuous diameter over its entire vertical extension.

In an embodiment, the component carrier is used for 5G (or higher versions, for instance 6G). Mobile wireless communication according to the 5G standard involves high-frequency transmission with a high transmitted data volume per time and therefore requires excellent properties in terms of high-frequency behavior. A component carrier according to an exemplary embodiment of the invention meets these demanding requirements. Fifth generation (5G) networks feature an increased mobile data rate, in particular significantly above 100 Mb/s. Fifth generation communication networks can experience superior network transmission fidelity when implementing a component carrier according to an exemplary embodiment of the invention.

In an embodiment, the component carrier is used for high-frequency applications in a range from 100 MHz to 300 GHz, in particular in a range from 20 GHz to 120 GHz. In particular, for such high frequencies, signal transmission is particularly sensitive to stub-caused parasitic effects. The high RF performance of component carriers according to exemplary embodiments of the invention allows low loss signal transmission even with such high-frequency values.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by filling them with electrically conductive material (in particular copper), thereby forming vias as hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular, an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photoimageable or dry-etchable organic material like epoxy-based build-up material (such as epoxy-based build-up film) or polymer compounds like polyimide, polybenzoxazole, or benzocyclobutene-functionalized polymers.

In an embodiment, the at least one electrically insulating layer structure comprises at least one of the group consisting of resin (such as rein-forced or non-reinforced resins, for instance epoxy resin or bismaleimide-triazine resin), cyanate ester resins, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon® is a registered mark of The Chemours Company FC LLC of Wilmington, Delaware, U.S.A. Reinforcing structures such as webs, fibers or spheres, for example made of glass (multilayer glass) may be used as well. Although prepreg particularly FR4 are usually preferred for rigid PCBs, other materials in particular epoxy-based build-up film or photoimageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, at least one of the electrically conductive layer structures comprises at least one of the group consisting of copper, aluminum, nickel, silver, gold, palladium, and tungsten. Although copper is usually preferred, other materials or coated versions thereof are possible as well, in particular, materials coated with supra-conductive material such as graphene.

At least one component, which can be optionally surface mounted on and/or embedded in the stack, can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular, structures comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular, copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

The aspects defined above, and further aspects of the invention, are apparent from the examples of embodiment to be described hereinafter and are explained with reference to these examples of embodiment.

BRIEF DESCRIPTION OF THE DRAWINGS

FIG. 4, FIG. 5, and FIG. 6 show cross-sectional views of structures obtained during manufacturing the component carrier according to FIG. 1.

FIG. 7 shows a plan view of a structure obtained during manufacturing the component carrier according to FIG. 1.

FIG. 8 and FIG. 9 show cross-sectional views of structures obtained during manufacturing the component carrier according to FIG. 1.

FIG. 10, FIG. 11, FIG. 12, FIG. 13, and FIG. 14 show structures obtained during manufacturing a component carrier according to another exemplary embodiment of the invention.

DETAILED DESCRIPTION OF ILLUSTRATED EMBODIMENTS

Figure 1:
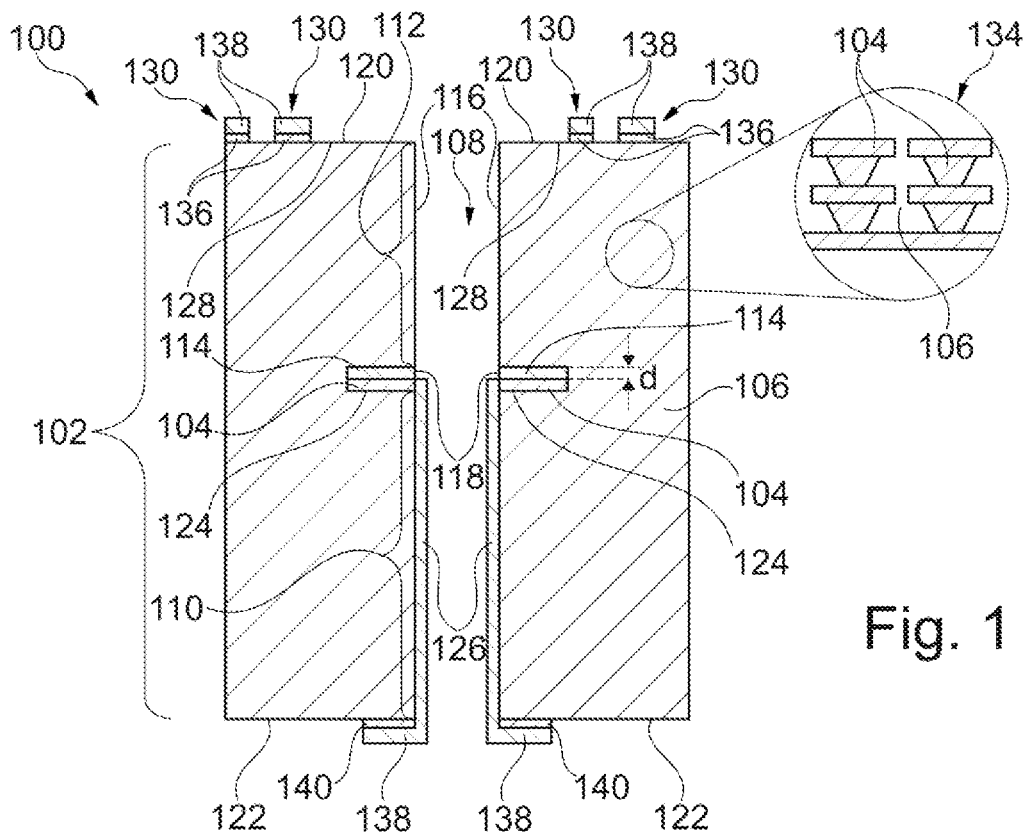
FIG. 1 illustrates a cross-sectional view of a component carrier according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

High-frequency PCB-type component carriers, in particular, for 5G applications, and especially for a base station or small cell, are frequently multi-layer component carriers (for example having more than 14 layers). Conventionally, such component carriers need back drill of a plated through hole to remove excessive copper of the hole wall to comply with strict demands concerning signal integrity. With the development of demanding PCBs, the line density may be increased, and the minimum hole size of a back-drill may be reduced. Compliance with such strict requirements may be difficult or even impossible with conventional processes.

In a conventional back-drill approach, lamination of a stack may be followed by the drilling of a hole in the stack which may be followed, in turn, by electroless copper formation. After subsequent electroplating, back-drilling may be carried out to remove excessive copper, but some undesired copper may remain. The hole may be produced by mechanically drilling. The depth and stub length adjusted by back-drilling are difficult to control. In particular, for small holes, there may be a high risk with block issues.

According to an exemplary embodiment of the invention, a component carrier (such as a printed circuit board, PCB) is provided which comprises a stack and a through hole in the stack, said through hole being uncovered with metal in one part but being covered with metal in another part. Advantageously, the uncovered part may be defined by one embedded dielectric having non-adhesive anti-plating properties and by a dielectric separation barrier disabling an electrically conductive connection between the uncovered hole portion and other electrically conductive structures of the stack. Such a configuration allows to deposit a substantial amount of metal only in the covered hole part, and to keep the uncovered hole part reliably free of metal upon completing manufacture of the component carrier. This allows to manufacture a stub-free component carrier having excellent properties in terms of its high frequency behavior and performance. As a result, signal loss in RF (radio frequency) applications may be strongly reduced, in particular in high layer number PCBs. Descriptively speaking, a PCB-manufacturing method may be provided which is capable of selectively removing partial copper for creating a plated through hole with only partially covered interior sidewalls.

In a preferred embodiment of the invention, an anti-plating dielectric structure is used only in an inner layer of the stack and may be synergistically combined with a separation barrier (which may be defined by a lithography process) to break an electrically conductive path in a second hole portion of a hole remaining free of metal in a readily manufactured component carrier. This may make it possible to selectively electroplate a first hole portion without electroplating the second hole portion. By implementing an anti-plating material only as an inner layer of the stack, it may be possible to obtain a good reliability performance. According to an exemplary embodiment of the invention, the anti-plating material may make it possible to avoid a cumbersome back-drill process. Furthermore, no hole block issue and no risk of misregistration may occur in a component carrier according to an exemplary embodiment of the invention. Further advantageously, a manufacturing process according to exemplary embodiments is significantly more stable compared to a conventional back-drill process. In particular, exemplary embodiments of the invention may be specifically applied for high density integration (HDI) and/or multi-layer board (MLB) component carriers which need partial plating of hole walls.

More specifically, an exemplary embodiment of the invention implements an insulation ring as separation barrier in additional to an anti-plating coating to break a conduction path in a whole portion which shall remain free of metal in a readily manufactured component carrier. For forming the separation barrier, a photolithography process may be implemented to break the conduction path. Exemplary embodiments of the invention may also be executed without seed material. Due to the described manufacturing method, it may be possible to manufacture a component carrier without creating a via barrel stub, which may advantageously eliminate the need to back-drill. Further advantageously, no coating residue may remain on an electroplating layer.

FIG. 1 illustrates a cross-sectional view of a component carrier 100 according to an exemplary embodiment of the invention.

The illustrated component carrier 100 may be a plate-shaped laminate-type component carrier, such as a printed circuit board (PCB). FIG. 1 shows a laminated stack 102 which is composed of electrically conductive layer structures 104 and electrically insulating layer structures 106 (compare detail 134). For instance, the electrically insulating layer structures 106 may be parallel dielectric layers. For example, the electrically conductive layer structures 104 may comprise patterned copper foils (i.e., patterned metallic layers) and vertical through-connections, for example copper filled laser vias. The electrically insulating layer structures 106 may comprise a resin (such as epoxy resin), optionally comprising reinforcing particles therein (for instance glass fibers or glass spheres). For instance, the electrically insulating layer structures 106 may be made of prepreg or FR4. The layer structures 104, 106 may be connected by lamination, i.e., the application of pressure and/or heat. In view of the configuration of the component carrier 100 described in the following, it is particularly appropriate for high-frequency applications.

Furthermore, the component carrier 100 comprises a vertical hole 108 (alternatively a slanted hole, not shown) extending through the entire stack 102, i.e., through all its layer structures 104, 106. Alternatively, hole 108 may also be a blind hole having a closed bottom, thereby extending only through part of the layer structures 104, 106 (not shown). Hole 108 may be formed by mechanically drilling with a drill bit through the stack 102 and may therefore have a constant diameter along its entire vertical extension. As shown, hole 108 has a first hole portion 110 (a lower hole portion according to FIG. 1) covered entirely with metal 126 and has a second hole portion 112 (an upper hole portion according to FIG. 1) not covered with metal 126 at all. The first hole portion 110 extends from bottom main surface 122 of stack 102 upwardly up to the anti-plating dielectric structure 114. The second hole portion 112 extends upwardly from the anti-plating dielectric structure 114 up to the upper main surface 120 of stack 102. The metal 126 may for instance be copper. Dielectric sidewalls of second hole portion 112 and delimited by electrically insulating material of stack 102 are shown with reference sign 116. Hence, vertical hole 108 is configured as an only partially plated through hole.

A vertical extension of the second hole portion 112 is defined by an anti-plating dielectric structure 114 and by an electroless plateable, but not electro-plateable separation barrier 128. The anti-plating dielectric structure 114 may be applied by printing a poorly adhesive or non-adhesive material on which plated metal does not adhere, whereas the separation barrier 128 may be defined lithographically. For high accuracy applications, applying anti-plating dielectric structure 114 may be carried out using a laser direct imaging (LDI) device. The described formation of the anti-plating dielectric structure 114 may break a conductive path during plating on a bottom side of second hole portion 112. The lithographic formation of the separation barrier 128, configured here as dielectric surface area on main surface 120 of stack 102 around hole 108, may break a conductive path during plating on a top side of second hole portion 112.

As shown in FIG. 1, the anti-plating dielectric structure 114 defines a lower end of the second hole portion 112. The anti-plating dielectric structure 114 is made of a poorly adhesive or even non-adhesive material, such as polytetrafluoroethylene or polyimide, and is thus configured so that no metallic material remains on the anti-plating dielectric structure 114 during electroless plating or electroplating of metal. Advantageously, the anti-plating dielectric structure 114 is hydrophobic so that no aqueous solution remains on the anti-plating dielectric structure 114, for instance during galvanic plating for forming a major portion of metal 126 in first hole portion 110 and below described plating structure 138. Advantageously, a thickness d of the anti-plating dielectric structure 114 may be very small, for instance 25 μm. This thickness may be large enough to ensure that the anti-plating dielectric structure 114 reliably breaks a conductive path along a vertical extension of hole 108 during electroplating for forming plated metal 126. At the same time, this thickness is small enough to make sure that the intra-layer adhesion within stack 102 remains sufficiently high for avoiding delamination, etc. For this reason and to keep foreign material in an interior of component carrier 100 small, it is also advantageous that only a single anti-plating dielectric structure 114 is provided in the stack 102.

In contrast to the anti-plating dielectric structure 114, the dielectric surface (for instance FR4 surface) of electroless plateable separation barrier 128 has a sufficient adhesion capability and is therefore suitable for being covered with metal formed by electroless plating. The electroless plateable separation barrier 128 is here embodied as an electrically insulating annular exposed surface portion of the stack 102 at its upper main surface 120. Thus, the separation barrier 128 is located at the upper first main surface 120 of the stack 102 (or alternatively at lower second main surface 122, not shown). More specifically, the electroless plateable separation barrier 128 corresponds to an annular dielectric surface area of the main surface 120 of the stack 102 surrounding in a circumferentially closed way the hole 108. For instance, the surface corresponding to the electroless plateable separation barrier 128 may be epoxy resin, optionally in combination with reinforcing glass structures (such as fibers or spheres). The electroless plateable separation barrier 128 is vertically aligned with the upper end of the second hole portion 112.

Still referring to FIG. 1, the first hole portion 110 is continuously lined with metal 126. For instance, metal 126 may form a hollow cylindrical structure (such as a copper barrel) on the sidewalls of the hole 108 in the first hole portion 110.

As shown, the anti-plating dielectric structure 114 is embedded in the stack 102 and is exposed only at an interface 118 between the first hole portion 110 and the second hole portion 112. In the present embodiment, the anti-plating dielectric structure 114 comprises a planar pad shaped as a ring. The dielectric pad-type anti-plating dielectric structure 114 is directly formed on an electrically conductive ring structure 124 embodied as an annular metallic pad and connected to a horizontally extending metallic trace (not visible in FIG. 1, compare reference sign 144 in FIG. 2). The electroless plateable electrically conductive ring structure 124 is physically connected and electrically coupled with the plated metal 126.

More specifically, the separation barrier 128 corresponds to an annular metal-free surface region on the upper main surface 120 of the stack 102. Said annular metal-free region constituting the separation barrier 128 is delimited at its laterally interior side by the upper end of the hole 108. Furthermore, said annular metal-free region constituting the separation barrier 128 is delimited at its laterally exterior side by a metallic structure 130. In the shown embodiment, the metallic structure 130 is a multi-layer structure. For instance, the metallic structure 130 may be composed of a patterned metal foil 136 with a plating structure 138 thereon.

As shown in FIG. 1 as well, the metal 126 in the first hole portion 110 extends up to and along part of lower main surface 122 of the stack 102. The horizontal extension of the metal 126 along part of the lower main surface 122 may be a multi-layer structure composed of a further patterned metal foil 140 with the above-mentioned plating structure 138 thereon.

By making sure that layer 126 extends upwardly along the entire sidewall of the first hole portion 110 only up to the electrically conductive ring structure 124 being directly connected to the (not illustrated) horizontal trace without extending into the second hole portion 112 above the electrically conductive ring structure 124, a stub-less radio-frequency component carrier 100 may be obtained. Since no stub of metallic material extends upwardly beyond the anti-plating dielectric structure 114 into the second hole portion 112, signal losses at an RF interface between tubular metal 126 and electrically conductive ring structure 124 as well as the horizontal trace connected therewith are significantly suppressed. Thus, signal coupling may be strongly improved and the high-frequency performance of the component carrier 100 may be excellent.

Advantageously, this may be achieved by configuring the anti-plating dielectric structure 114 to spatially separate the second hole portion 112 from the metal 126 covering the first hole portion 110. Consequently, the anti-plating dielectric structure 114 defines a clear interface between the metallized first hole portion 110 and the non-metallized second hole portion 112. Furthermore, the separation barrier 128 separates the second hole portion 112 from metallic structure 130 outside of the hole 108 on upper main surface 120.

In view of the reliable breakage of the conductive plating path by the described interaction between anti-plating dielectric structure 114 and separation barrier 128, the hole 108 is partially plated only in the first hole portion 110 but not in the second hole portion 112. Hence, there is no need for back drilling for removing a disturbing stub.

In the following, a method of manufacturing component carrier 100 according to FIG. 1 will be described referring to FIG. 2 to FIG. 9.

Figure 2:
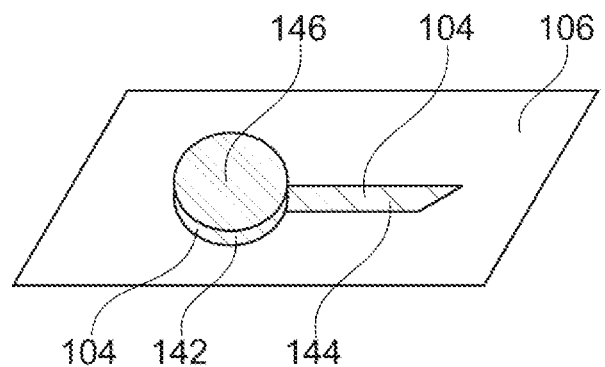
FIG. 2 and FIG. 3 show three-dimensional views of structures obtained during manufacturing the component carrier according to FIG. 1.
Figure 3:
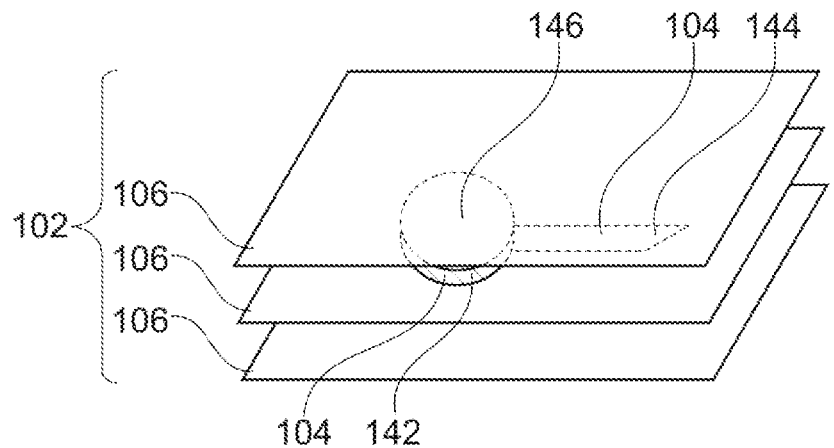

FIG. 2 and FIG. 3 show three-dimensional views of structures obtained during manufacturing the component carrier 100 according to FIG. 1. FIG. 4 to FIG. 6 show cross-sectional views of structures obtained during manufacturing the component carrier 100 according to FIG. 1. FIG. 7 shows a plan view of a structure obtained during manufacturing the component carrier 100 according to FIG. 1. FIG. 8 and FIG. 9 show cross-sectional views of structures obtained during manufacturing the component carrier 100 according to FIG. 1.

Referring to FIG. 2, an electrically insulating layer structure 106 is shown on which a patterned metal layer is formed as an electrically conductive layer structure 104. Said patterned metal layer comprises a circular pad 142 connected with a horizontal trace 144. Circular pad 142 and horizontal trace 144 may be formed of copper. A dielectric circular pad 146 of anti-plating material may then be applied on the metallic circular pad 142, for instance by printing.

Referring to FIG. 3, the structure of FIG. 2 is shown after placing a plurality of further electrically insulating layer structures 106 thereon, for instance prepreg sheets. Hence, a build-up for forming stack 102 may be created. The illustrated layer structures 104, 106 with anti-plating dielectric pad 146 in between may then be connected by lamination, i.e., mechanical pressure and/or heat.

Referring to FIG. 4, an obtained stack 102 is shown which comprises a plurality of electrically conductive layer structures 104 (in particular, the embedded electrically insulating layer structure 104 described referring to FIG. 2 and two copper foils as metal foils 136, 140 on the two main surfaces 120, 122 of stack 102) and electrically insulating layer structures 106 (such as prepreg sheets being cured during lamination). In order to obtain the structure according to FIG. 4, a vertical through hole 108 is mechanically drilled in the stack 102. By said drilling, also central portions of metallic pad 142 and dielectric pad 146 are penetrated, so that metallic pad 142 is transferred into electrically conductive ring structure 124 and dielectric pad 146 is converted into annular anti-plating dielectric structure 114. Preferably, electrically conductive ring structure 124 and annular anti-plating dielectric structure 114 form a double layer stack with circular outline and mutually aligned through holes. A portion of hole 108 below anti-plating dielectric structure 114 forms a first hole portion 110 and portion of hole 108 above anti-plating dielectric structure 114 forms a second hole portion 112 (compare FIG. 1). In view of the mechanical drilling process for forming hole 108, hole 108 has a constant diameter D along its entire vertical extension. For instance, D may be 200 µm. More generally, D may be in a range from 150 µm to 400 µm.

Referring to FIG. 5, the structure shown in FIG. 4 is subjected to electroless plating, in particular, for forming a thin layer of chemical copper. Hence, an entire surface of the structure shown in FIG. 4 is metallized, except the anti-plating dielectric structure 114 being made of material on which plated metal does not adhere. Inter alia, a corresponding metallic structure 132 may be formed on the exposed dielectric surface of stack 102 in hole 108. Metallic structure 132 may be a chemically formed seed layer (in particular, a palladium base layer and a copper layer grown thereon) or a physically formed seed layer (in particular, a sputtered seed layer). Metallic structure 132 may later constitute part of metal 126 in first hole portion 110 and may be only temporary in second hole portion 112, i.e., may be removed later. More specifically, seed layer-type metallic structure 132 may later function only in first hole portion 110 as an electrode to which an electric current may be applied during forming the substantial part of metal 126 by electroplating.

Referring to FIG. 6 and FIG. 7, metallic material (composed of metal foil 136 and metallic structure 132) may be patterned selectively on first main surface 120 by lithography to thereby expose an annular dielectric surface portion of stack 102 for creating separation barrier 128. More specifically, the separation barrier 128 is formed as an annular dielectric surface area on the first main surface 120 of the stack 102 and is delimited at an exterior side by metallic structure 130 on the first main surface 120 and is delimited at an interior side by temporary metallic structure 132 partially on the first main surface 120 and partially in the upper portion of the vertical through hole 108. Formation of separation barrier 128 may for instance be accomplished by a lithography and etching process which patterns the frontside metal on first main surface 120. In this context, it is for instance possible to form a photoresist on the frontside metal and to pattern the photoresist, for instance using a photomask. Through a recess in the photomask, only a selected surface portion of the frontside metal is exposed which can then be subjected to etching for forming the annular separation barrier 128 in the frontside metal.

As seen in FIG. 6 and FIG. 7, the described process modifies temporary metallic structure 132 in form of an isolated metallic ring structure 148 partially at the exterior first main surface 120 of the stack 102 and partially in the second hole portion 112. Hence, the described process forms the electroless plateable separation barrier 128 as an annular recess delimited at an exterior side by metallic structure 130 on a surface portion of the first main surface 120 of the stack 102 remote from hole 108. Moreover, separation barrier 128 is delimited at an interior side by the further temporary metallic structure 132 partially on a surface portion of the first main surface 120 of the stack 102 directly around the hole 108 and partially in the hole 108 extending into stack 102.

Referring to FIG. 8, the structure shown in FIG. 7 is subjected to electroplating, in particular galvanic plating. During electroplating, a plating-triggering electric current or voltage may be applied to the electrically conductive surface areas on lower main surface 122 and in first hole portion 110 as well as exterior to separation barrier 128 on upper main surface 120. No plating-triggering current or voltage is applied to the two-sided isolated electrically conductive surface of electrically decoupled metallic structure 132. More specifically, metallic structure 132 in and around second hole portion 112 is isolated between anti-plating dielectric structure 114 and separation barrier 128. Consequently, electroplating will lead to the formation of a plating structure 138 only in the first hole portion 110, on the second main surface 122 and exterior to the separation barrier 128 on first main surface 120. In contrast to this, no plating structure 138 will be formed on metallic structure 132 in and around second hole portion 112. As a result, the first hole portion 110 will be covered with electroplating metal 126, whereas the second hole portion 112 will not be covered with electroplating metal. Hence, the second hole portion 112 is protected against electroplating by isolating the second hole portion 112 and a connected ring on first main surface 120 between the anti-plating dielectric structure 114 and the separation barrier 128. Defining separation barrier 128 by etching for breaking the conductive path in second hole portion 112 allows for a very simple processing.

Referring to FIG. 9, the structure shown in FIG. 8 subjected to etching, in particular, wet etching. Said etching process may also be denoted as micro-etching. The etching process may also be embodied as flash etching with low current. Consequently, a certain thickness of surface metal is removed from all exposed metallized surfaces of the structure shown in FIG. 8. The amount of removed metal (which may be adjusted by adjusting the etching parameters, in particular the etching time and the etching chemistry) may be selected so that the entire electroless plating metal of temporary metallic structure 132 in the second hole portion 112 is removed. However, metal 126 remains in first hole portion 112, and multi-layer metallic structures 130 remain on parts of the first main surface 120 and on the entire second main surface 122.

In order to obtain component carrier 100 according to FIG. 1, a remaining portion of said temporary metallic structure 132 interior of the separation barrier 128 on first main surface 120 may be removed, the multi-layer metallic structure 130 may be patterned on first main surface 120, and the multi-layer metallic structure comprising metal foil 140 and plating structure 138 may be patterned on second main surface 122.

Advantageously, the described embodiment breaks the conductive path of plating in the second hole portion 112, so that the hole 108 is only partially plated in first hole portion 110. This eliminates the conventional need to back drill for removal of a stub in order to reduce losses in RF applications. Advantageously, a print process may be used to apply the anti-plating material. For increasing accuracy, it may be possible to apply an LDI machine applying the anti-plating directly structure 114, which may for instance be made of polyimide or Teflon material.

A lithography process for defining separation barrier 128 may be carried out to break a conductive path to spatially define electroplating. Advantageously, the resistance material of anti-plating dielectric structure 114 cannot be metalized by a metallization process and may nevertheless have a sufficiently good adhesion with prepreg and copper. Metallization may include but is not limited to the formation of electroless copper. Advantageously, exemplary embodiments do not involve a risk of blockage for a small hole (for instance with a hole size of less than 250 µm, for example 200 µm). Moreover, a good stub length control performance may be achieved.

Figure 12:
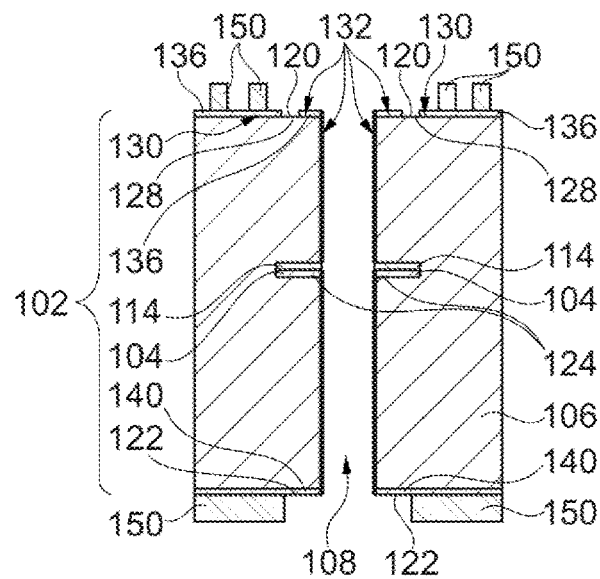
Figure 13:
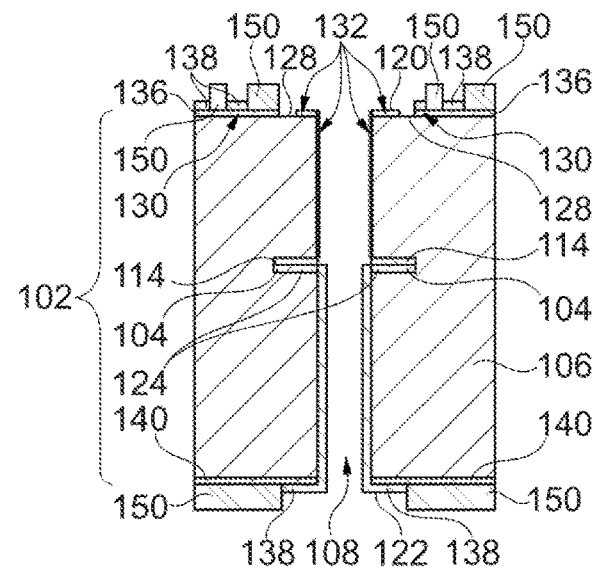
Figure 14:
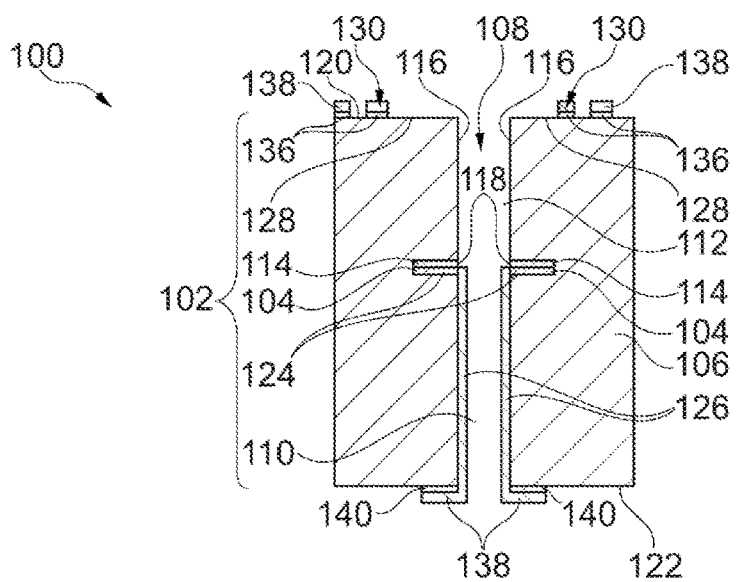

FIG. 10 to FIG. 14 show structures obtained during manufacturing a component carrier 100 according to another exemplary embodiment of the invention. FIG. 10 shows a cross-sectional view of a structure obtained during manufacturing the component carrier 100. FIG. 11 shows a plan view of a structure obtained during manufacturing the component carrier 100. FIG. 12 to FIG. 14 show cross-sectional views of structures obtained during manufacturing the component carrier 100.

The structures shown in FIG. 10 and FIG. 11 correspond to the structures shown in FIG. 6 and FIG. 7, respectively, and can be manufactured accordingly.

Referring to FIG. 12, a resist 150 may be formed and patterned both on first main surface 120 and second main surface 122. For example, resist 150 may be a photoresist or dry film. Alternatively, it is possible that also the resist 150 is made of an anti-plating material, for instance one of the materials described herein for the anti-plating dielectric structure 114.

Referring to FIG. 13, the structure shown in FIG. 12 may be subjected to selective electroplating (in particular galvanic plating) corresponding to FIG. 8, i.e., excluding the region between anti-plating structure 114 and separation barrier 128. Furthermore, no plating structure 138 is formed in surface regions covered by resist 150. The process according to FIG. 13 may be pattern plating (for instance involving copper and tin).

Referring to FIG. 14, the resist 150 may be removed from both opposing main surfaces 120, 122, for instance by stripping. Thereafter, the obtained structure may be subjected to etching, as described above referring to FIG. 9. This may remove temporary metallic structure 132 in second hole portion 112 and exposed portions of metal foils 136, 140 on main surfaces 120, 122. The structure may also be subjected to tin stripping. Advantageously, tin may protect the pattern.

Figure 15:
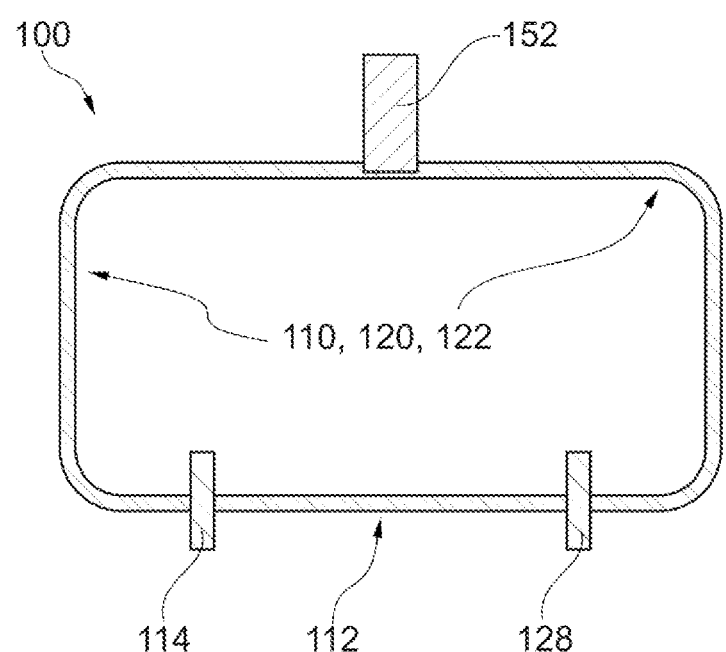
FIG. 15 is a schematic view of a component carrier during manufacture according to an exemplary embodiment of the invention.

FIG. 15 illustrates a schematic view of a component carrier 100 according to an exemplary embodiment of the invention during electroplating according to FIG. 8 or FIG. 13. Schematically, an electrically conductive clamp 152 is shown by which an electric current or an electric voltage is supplied to the first hole portion 110, as well as to part of first main surface 120 and to part of second main surface 122 during electroplating. In contrast to this, no electric current or voltage is applied by clamp 152 to second hole portion 112 since this conductive path is broken by anti-plating dielectric structure 114 and separation barrier 128. Hence, anti-plating material and a physical separation may be used to break the conductive path. In particular, etching process forming separation barrier 128 may also contribute to the breakage of the conductive path. In the absence of electricity in isolated second hole portion 112, it will not be plated. Advantageously, the described process can be carried out with a short cycle time. Furthermore, no material residuals may remain on the surface. Apart from this, the etching process is easy to control. Furthermore, the ecological footprint during manufacture may be reduced, since the material may have volatile matter, and the process only uses material one time.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants are possible which variants use the solutions shown and the principle according to the invention even in the case of fundamentally different embodiments.

The invention claimed is:

1. A component carrier, comprising:
a stack comprising at least one electrically conductive layer structure and/or at least one electrically insulating layer structure; and
a hole in the stack having a first hole portion covered with metal and having a second hole portion not covered with metal;
wherein the second hole portion is defined by an anti-plating dielectric structure and an electroless plateable separation barrier,
wherein the second hole portion extends upwardly from the anti-plating dielectric structure up to an upper main surface of the stack.

2. The component carrier according to claim 1, wherein the first hole portion is continuously lined with the metal.

3. The component carrier according to claim 1, wherein the anti-plating dielectric structure is embedded in the stack and is exposed only at an interface between the first hole portion and the second hole portion.

4. The component carrier according to claim 1, wherein the separation barrier is located at a main surface of the stack.

5. The component carrier according to claim 1, wherein the anti-plating dielectric structure comprises a planar pad.

6. The component carrier according to claim 1, wherein the anti-plating dielectric structure comprises an inlay.

7. The component carrier according to claim 1, wherein the anti-plating dielectric structure is formed on a metallic pad connected to a metallic trace.

8. The component carrier according to claim 1, wherein the separation barrier comprises an annular metal-free region on a main surface of the stack, delimited at an exterior side by a metallic structure.

9. The component carrier according to claim 1, comprising an electrically conductive ring structure connected with the anti-plating dielectric structure.

10. The component carrier according to claim 9, wherein the electrically conductive ring structure is connected with the metal.

11. The component carrier according to claim 1, wherein the anti-plating dielectric structure is hydrophobic.

12. The component carrier according to claim 1, wherein the anti-plating dielectric structure comprises at least one of a group consisting of a release ink, polytetrafluoroethylene, and polyimide.

13. The component carrier according to claim 1, wherein the hole has a substantially constant diameter in the first hole portion and in the second hole portion.

14. The component carrier according to claim 1, wherein a vertical thickness of the anti-plating dielectric structure is in a range from 10 µm to 50 µm.

15. The component carrier according to claim 1, wherein the metal in the first hole portion extends up to and along at least part of a main surface of the stack.

16. The component carrier according to claim 1, comprising at least one of the following features:
   the component carrier is configured as stub-less radiofrequency component carrier;
   wherein the second hole portion extends between the anti-plating dielectric structure and the separation barrier;
   wherein the anti-plating dielectric structure comprises a dielectric ring structure; comprising only a single anti-plating dielectric structure;
   wherein the anti-plating dielectric structure separates the second hole portion from the metal covering the first hole portion;
   wherein the separation barrier separates the second hole portion from a metallic structure outside of the hole, wherein the metallic structure is a multi-layer structure;
   wherein the separation barrier is not electro-plateable;
   wherein the second hole portion is electrically isolated by and between the anti-plating dielectric structure and the separation barrier;
   wherein the hole is a vertical hole.

17. A method of manufacturing a component carrier, comprising:
   providing a stack comprising at least one electrically conductive layer structure and/or at least one electrically insulating layer structure;
   forming a hole in the stack with a first hole portion covered with metal and with a second hole portion not covered with metal;
   defining the second hole portion by an anti-plating dielectric structure and an electroless plateable separation barrier; and
   wherein the second hole portion extends from the anti-plating dielectric structure to a main surface of the stack.

18. The method according to claim 17, comprising at least one of the following features:
   wherein the method comprises forming the separation barrier by lithography;
   wherein the method comprises forming the separation barrier as an annular dielectric surface area on a main surface of the stack delimited at an exterior side by a metallic structure on the main surface and delimited at an interior side by a temporary metallic structure partially on the main surface and partially in the hole;
   wherein the method comprises forming the hole by drilling;
   wherein the method comprises processing the first hole portion and the second hole portion by electroless plating of metal in both the first hole portion and the second hole portion, followed by electroplating of metal in the first hole portion but not in the second hole portion, and followed by removing the electroless plated metal in the second hole portion.

19. A method, comprising:
   providing a stack with at least one electrically conductive layer structure and/or at least one electrically insulating layer structure; and
   a hole in the stack having a first hole portion covered with metal and having a second hole portion not covered with metal;
   wherein the second hole portion is defined by an anti-plating dielectric structure and an electroless plateable separation barrier, the second hole portion extending from the anti-plating dielectric structure to a main surface of the stack; and
   using the component carrier for conducting a signal having a frequency greater than or equal to 100 MHz.

20. The method according to claim 19, comprising at least one of the following features:
   wherein the component carrier is used for wireless communication;
   wherein the component carrier is used for high-frequency applications with frequencies in a range from 100 MHz to 300 GHz.

* * * * *